US010652497B2

(12) United States Patent
Fossum et al.

(10) Patent No.: US 10,652,497 B2
(45) Date of Patent: May 12, 2020

(54) QUANTA IMAGE SENSOR WITH POLARIZATION-SENSITIVE JOTS

(71) Applicant: TRUSTEES OF DARTMOUTH COLLEGE, Hanover, NH (US)

(72) Inventors: Eric R. Fossum, Wolfeboro, NH (US); Leo Anzagira, Hanover, NH (US)

(73) Assignee: Trustees of Dartmouth College, Hanover, NH (US)

( * ) Notice: Subject to any disclaimer, the term of this patent is extended or adjusted under 35 U.S.C. 154(b) by 164 days.

(21) Appl. No.: 15/960,547

(22) Filed: Apr. 23, 2018

(65) Prior Publication Data
US 2018/0309949 A1 Oct. 25, 2018

Related U.S. Application Data

(60) Provisional application No. 62/488,611, filed on Apr. 21, 2017.

(51) Int. Cl.
| | |
|---|---|
| *H01L 27/146* | (2006.01) |
| *H04N 5/378* | (2011.01) |
| *G02B 27/28* | (2006.01) |
| *G02B 5/20* | (2006.01) |
| *G02B 5/30* | (2006.01) |
| *H04N 9/04* | (2006.01) |
| *G01J 4/04* | (2006.01) |

(52) U.S. Cl.
CPC ............. *H04N 5/378* (2013.01); *G01J 4/04* (2013.01); *G02B 5/201* (2013.01); *G02B 5/3058* (2013.01); *G02B 27/288* (2013.01); *H01L 27/14621* (2013.01); *H04N 9/04555* (2018.08)

(58) Field of Classification Search
CPC ........... G02B 27/288; H01L 27/14621; H04N 9/04555; G01J 4/04
USPC .................... 250/208.1, 214 R, 226
See application file for complete search history.

(56) References Cited

U.S. PATENT DOCUMENTS 8,723,132 B2 * 5/2014 Baeumer ............... G01T 1/2018
250/370.11

* cited by examiner

*Primary Examiner* — Que Tan Le
(74) *Attorney, Agent, or Firm* — David V. Rossi; Haug Partners LLP

(57) ABSTRACT

Some embodiments provide an image sensor that includes (i) quanta image sensor having an array of jots and configured for spatial and temporal oversampling, and (ii) a polarization filter array monolithically integrated with the quanta image sensor, so as to provide for a polarization image sensor. The image sensor may also include a color filter array.

8 Claims, 7 Drawing Sheets

Fig. 4. Plots of Angle of polarization calculated from simulation vs. actual angle of polarization for different sized pixel outputs. (a) Uses a 1-Jet pixel (b) Pixel is formed from sum of 2x2 Jets (c) Pixel is formed from sum of 16x16 Jets

QUANTA IMAGE SENSOR WITH POLARIZATION-SENSITIVE JOTS

RELATED APPLICATIONS

This application claims the benefit of U.S. Provisional Application No. 62/488,611, filed Apr. 21, 2017, which is hereby incorporated herein by reference in its entirety.

BACKGROUND

In human vision, light wavelength and intensity are perceived as color and brightness, respectively. Humans, however, lack the ability to perceive one fundamental physical property of light—its polarization. Information about light polarization can, however, be captured by image sensors and used to perform tasks such as contrast enhancement, material identification, and edge detection, etc. Image sensors used for polarization imaging may employ a CMOS or CCD image sensor with a polarization filter bonded to it or integrated monolithically.

Two prevalent architectures for sampling polarization intensity are "division-of-time" and "division-of-focal-plane" sensors. In division-of-time polarization imagers, a CMOS or CCD image sensor is coupled with a polarization filter designed such that it can be mechanically, electrically, or acousto-optically modulated to change the light transmission axis, allowing for different polarization intensities to be captured from frame to frame. More specifically, such division-of-time polarization imagers require switching polarization filters from frame to frame to capture 3 or more polarization frames to compute the angle and degree of polarization. A drawback of these sensors is that the frame rate is limited, and motion during imaging causes image blur and distortion. Division-of-focal-plane imagers, on the other hand, use a polarization filter array over the pixels such that each pixel samples the intensity of light transmitted through one polarization filter. In a similar manner to the interpolation done in color images, the missing polarization intensities at each pixel location can be recovered from neighboring pixels. In other words, such division-of-focal plane imagers use a mosaic of polarization filters and perform interpolation in a similar way to demosaicing in conventional color imagers to obtain three or more polarization channels for all pixels. This results in reduced spatial resolution when conventional image sensors are employed.

Another fundamental limitation of conventional polarization imagers is their inability to efficiently and simultaneously capture color and polarization images. A common approach for obtaining color and polarization information involves the modulation of the color filter over an array of polarization-sensitive pixels, to sequentially capture different color frames in addition to the polarization intensities [See K. P. Bishop, H. D. McIntire, M. P. Fetrow, and L. McMackin, "Multispectral polarimeter imaging in the visible to near IR," Proc. SPIE 3699, 49-57 (1999)]. This method is limited by the need for electrical or mechanical modulation of the filters. Another method, disclosed in U.S. Pat. No. 8,411,146 to Twede, involves stacking a polarization filter array over a color filter array. In this method, color frames and near-infrared polarization frames are sequentially captured by modulating the light reaching the focal plane array. A more recent approach involves the use of three vertically stacked p-n junctions at different depths in silicon to sample the short, medium, and long wavelengths transmitted through the polarization filter [See M. Kulkarni and V. Gruev, "Integrated spectral-polarization imaging sensor with aluminum nanowire polarization filters," Opt. Express 20, 22997-23012 (2012)]. Because a silicon coefficient decreases with wavelength, shorter wavelengths will be absorbed more in the top p-n junctions, while longer wavelengths will dominate the signal in the bottom p-n junction. This allows full color reproduction, but interpolation is required to obtain missing polarization intensities at each pixel location. The complexity of the readout circuitry as well as poor color separation of the three junctions reduces the appeal of this method.

Yet another challenge that polarization imagers have to contend with is the trend of decreasing pixel sizes in CMOS image sensors. As pixel sizes decrease, such sensors face the same limitations as conventional imagers, including reduced full-well capacity and dynamic range, and concomitantly reduced signal-to-noise ratio (SNR) and image quality. In polarization imagers, this translates into a reduction in the range of polarization information that can be resolved.

SUMMARY OF SOME ILLUSTRATIVE EMBODIMENTS

The present disclosure relates to integration (e.g., monolithic integration) of a quanta image sensor (QIS) with a polarization filter to address at least some of the issues (e.g., limitations) of conventional polarization imagers. The QIS comprises sub-diffraction-limit (SDL) pixels known as jots to capture an image by oversampling in both the temporal and spatial domains. These jots may be sensitive to single photons and produce single-bit outputs, in which case they are termed single-bit jots. Alternatively, the jot may produce more 2 or more bits of output and is termed a multi-bit jot.

For clarity and ease of reference, it is noted that the term "kernel" (or similarly, "unit kernel"), as used herein, refers to a minimal repeating pattern of filter elements of a filter array that is replicated (e.g., two-dimensionally) over the full extent of the filter array. By way of non-limiting example, a filter array may refer to a polarization filter array comprised of an array of polarization filter elements, or a color filter array comprised of color filter elements, or a combination of a polarization filter array and a color filter array (referred to herein as an "integrated polarization-color filter array) that comprises both polarization filter elements (covering a set of jots) and color filter elements (covering a different set of jots). In this regard, it will be understood that a kernel of an integrated polarization-color filter array is a combination of a polarization filter array kernel and a color filter array kernel. It will also be understood in view of the present disclosure that a polarization (color) kernel may include array elements that do not include a polarization (color) filter element.

In some embodiments, a polarization filter array is configured such that respective polarization filter elements in the kernel overlay respective individual jots. In some embodiments a polarization filter array is configured such that respective polarization filter elements in the kernel each overlay respective groups of two or more jots. Some embodiments provide a QIS integrated with mixed polarization-color filter array.

It will be appreciated by those skilled in the art that the foregoing brief description and the following description with respect to the drawings are illustrative and explanatory of some embodiments of the present invention, and are neither representative nor inclusive of all subject matter and embodiments within the scope of the present invention, nor intended to be restrictive or characterizing of the present invention or limiting of the advantages which can be achieved by embodiments of the present invention, nor intended to require that the present invention necessarily provide one or more of the advantages described herein with respect to some embodiments. Thus, the accompanying drawings, referred to herein and constituting a part hereof, illustrate some embodiments of the invention, and, together with the detailed description, serve to explain principles of some embodiments of the invention.

BRIEF DESCRIPTION OF THE DRAWINGS

Aspects, features, and advantages of embodiments of the invention, both as to structure and operation, will be understood and will become more readily apparent when the invention is considered in the light of the following description made in conjunction with the accompanying drawings, in which like reference numerals designate the same or similar parts throughout the various figures, and wherein.

DETAILED DESCRIPTION OF SOME EMBODIMENTS

Figure 1:
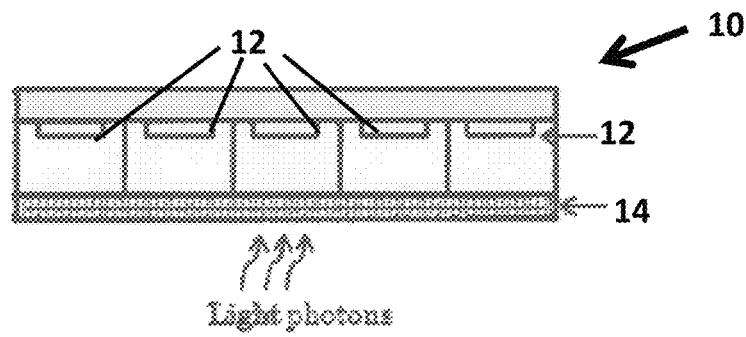
FIG. 1 schematically depicts a cross sectional view of a portion of a simplified illustrative backside illuminated Quanta Image Sensor (QIS) with a polarization filter array, according to some embodiments.

Throughout the description and claims, the following terms take at least the meanings explicitly associated herein, unless the context dictates otherwise. The meanings identified below do not necessarily limit the terms, but merely provide illustrative examples for the terms.

The phrase "an embodiment" as used herein does not necessarily refer to the same embodiment, though it may. Similarly, the phrase "some embodiments" as used herein at different instances does not necessarily refer to the same "some embodiments," though it may. In addition, the meaning of "a," "an," and "the" include plural references; thus, for example, "an embodiment" is not limited to a single embodiment but refers to one or more embodiments. Similarly, the phrase "one embodiment" does not necessarily refer the same embodiment and is not limited to a single embodiment. As used herein, the term "or" is an inclusive "or" operator, and is equivalent to the term "and/or," unless the context clearly dictates otherwise. The term "based on" is not exclusive and allows for being based on additional factors not described, unless the context clearly dictates otherwise.

The terms "color filter," "color filter element," or similar terms, as used herein in accordance with their ordinary and customary meaning to those skilled in the art, may be understood to refer to, for example, a component (e.g., a material layer) that selectively transmits light within a certain range of wavelengths (e.g., corresponding to a portion of the color spectrum), the color filter thus having a wavelength-dependent transmission characteristic such that it transmits light within the certain range of wavelengths (sometimes referred to as the "passband"), while substantially absorbing (and/or reflecting) light having wavelengths (or color) outside of the passband.

As used herein, two filter elements are "adjacent" or "neighboring" if they are disposed near each other without any intervening filter element; thus, "adjacent" or "neighboring" filter elements may share a border and/or share a corner or point (though they may not necessarily contact each other at the border and/or point). In addition, as used herein, the term "nearest neighbor" with respect to any given filter element in a filter array refers to an adjacent filter having a minimum distance to the given filter element as may be measured along a line between corresponding points on the adjacent and given filter elements, in accordance with the ordinary and customary meaning of "nearest neighbor" in the context of arrays, as understood by those skilled in the art. Similarly, the term "next-nearest-neighbor" with respect to any given filter element in a filter array refers to an adjacent filter having the next-shortest distance (greater than the minimum distance) to the given filter element as may be measured along a line between corresponding points on the adjacent and given filter elements, in accordance with the ordinary and customary meaning of "next-nearest-neighbor" in the context of arrays, as understood by those skilled in the art. It may be understood, for example, that a given filter element may have more than one nearest neighbor as well as more than one next-nearest-neighbor.

Further, it will be understood that for ease of reference and clarity of exposition with respect to a regular, rectangular (e.g., square) array, having elements arranged in a row/column configuration, the terms "vertical" and "horizontal" will be used herein to refer to orthogonal directions between nearest neighbor color elements, whereas "diagonal" will be used herein to refer to the direction between next-nearest-neighbor color elements. While these terms may reflect the perspective of the referenced figures on the page and/or conventional reference to image sensor pixel arrays with respect to readout circuitry, it is understood that no preferred orientation is implied by such nomenclature; e.g., "row" and "column" designations are interchangeable, as are "horizontal" and "vertical" designations.

The term "substrate" is to be understood as a semiconductor-based material such as silicon, silicon-on-insulator (SOI) or silicon-on-sapphire (SOS) technology, doped and undoped semiconductors, epitaxial layers of silicon supported by a base semiconductor foundation, and other semiconductor structures. In addition, the semiconductor need not be silicon-based, but may be based on, for example, silicon-germanium, germanium, or gallium arsenide.

In polarization imaging, the state of polarization of light is usually quantified in terms of optical intensity by measuring the light transmitted through different polarization filters. The intensity information obtained for the different polarization filters can then be used to calculate a set of values known as Stokes parameters which describe the total intensity as well as the degree of linear and circular polarization of the light. For instance, if the light transmitted through 0°, 45°, 90° and 135° polarization filters are given by $I_0$, $I_{45}$, $I_{90}$, and $I_{135}$, respectively, then the Stokes parameters may be calculated using equations (1)-(3).

$$S_0 = \frac{1}{2}(I_0 + I_{45} + I_{90} + I_{135}) \quad (1)$$

$$S_1 = (I_0 - I_{90}) \quad (2)$$

$$S_2 = (I_{45} - I_{135}) \quad (3)$$

From these Stokes parameters, the angle of polarization (AoP) and degree of linear polarization (DoLP) can be calculated with equations (4) and (5).

$$AoP = \frac{1}{2} \tan^{-1}\left(\frac{s_2}{s_1}\right) \quad (4)$$

$$DoLP = \frac{\sqrt{s_1^2 + s_2^2}}{s_0} \quad (5)$$

A polarization filter array may therefore be used in a similar fashion to color filter arrays and the missing intensity value can be interpolated for per-pixel calculation of the Stokes parameters as well as the angle and degree of polarization.

As further described hereinbelow, in accordance with some embodiments according to the present disclosure, polarization filters are disposed over pixels in a Quanta Image Sensor (QIS) to capture light polarization information. A QIS comprises sub-diffraction-limit (SDL) pixels known as jots to capture an image by oversampling in both the temporal and spatial domains. These jots may be sensitive to single photons and produce single-bit outputs, in which case they are termed single-bit jots. Alternatively, the jot may produce more 2 or more bits of output (corresponding to integration of, by way of non-limiting example, a few photoelectrons, or perhaps up to about 31, or 63, or, e.g., 127 photoelectrons), and is termed a multi-bit jot. The extremely small size of the jots (e.g., such as less than a few hundred nanometers, by way of non-limiting example) facilitates spatial oversampling, while a fast readout speed (such as >1000 fields/s, by way of non-limiting example) allows temporal oversampling of the image.

A QIS provides for a number of advantages, including, e.g., high dynamic range and possibility of removing motion blur. Pixel size can also be dynamically changed by varying the number of jots which are summed in the pixel output. The resolution may be traded off for sensitivity depending on the conditions. In addition, the high spatial oversampling reduces restrictions on the color filter patterns used over the jots. Since the sampling frequency of the jots may be much higher than the Nyquist rate, many different patterns may be used and more colors filters may be included without risk of color aliasing.

A pixel in the final image is formed from the outputs of a spatiotemporal kernel/cube of jots in the QIS device. High full-well can be attained by summing more jots to produce a pixel. The low noise floor and high full-well capability equate to a high dynamic range. A QIS also significantly increases the range of post-capture processing that can be performed on the image because the spatial and temporal information from incident photons is captured. For instance, motion blur can be minimized (as mentioned) by shifting frames in the temporal domain. The pixel sizes in the final image can also be dynamically changed by varying the size of the kernel of jots used in forming pixels.

In accordance with some embodiments of the present disclosure, the benefits of the QIS are leveraged to form a polarization sensitive imager by adding polarization filters over each single-photon-sensitive jot to selectively transmit light of a particular polarization. The jots used may be single-bit or multi-bit jots. In some embodiments, polarization filters such as wire grid polarizers may be implemented monolithically on the backside of the single jot image sensor. As will be further understood in view of the present disclosure, a QIS configured to employ spatial and temporal oversampling using jots having single-photon sensitivity combined with a polarization filter array addresses at least some of the issues (e.g., limitations) of conventional polarization imagers (such as those discussed in the Background section above).

In accordance with some embodiments, FIG. 1 schematically depicts a cross-sectional view of a portion of a simplified illustrative backside illuminated Quanta Image Sensor (QIS) 10 comprising any array of single photon jots 12 and having a polarization filter array 14 disposed at the bottom (e.g., "backside" of the substrate). While the jots 12 shown in FIG. 1 use backside illumination technology, front-side illumination may be implemented in alternative embodiments.

It will be understood that QIS jots may be implemented as, for example, pump-gate jots; however, any suitable jot device for implementing a single-bit or multi-bit QIS (e.g., having sufficient conversion gain and noise floor for single photocarrier detection) may be employed. Additional aspects and details concerning implementations of a QIS in a polarization-QIS in accordance with embodiments of the present disclosure may be understood by those skilled in the art in view of, for example, each of the following publications, each of which is hereby incorporated by reference herein in its entirety: (i) PCT international application publication no. WO/2015/153806 (corresponding to PCT international application no. PCT/US2015/023945), "CMOS Image Sensor with Pump Gate and Extremely High Conversion Gain," published Oct. 8, 2015, (ii) J. Ma and E. R. Fossum, A Pump-Gate Jot Device with High Conversion Gain for Quanta Image Sensors, IEEE J. Electron Devices Society, vol. 3(2), pp. 73-77, March 2015, (iii) J. Ma and E. R. Fossum, Quanta image sensor jot with sub 0.3e-r.m.s. read noise and photon counting capability, IEEE Electron Device Letters, vol. 36(9), pp. 926-928, September 2015, (iv) J. Ma, D. Starkey, A. Rao, K. Odame, and E. R. Fossum, Characterization of quanta image sensor pump-gate jots with deep sub-electron read noise, IEEE J. Electron Devices Society, vol. 3(6), pp. 472-480, November 2015, and (v) S. Masoodian, A. Rao, J. Ma, K. Odame and E. R. Fossum, A 2.5 pJ/b binary image sensor as a pathfinder for quanta image sensors, IEEE Trans. Electron Devices, vol. 63(1), pp. 100-105, January 2016.

It will be understood that the polarization array 14 in the illustrative embodiment of FIG. 1 comprises an array of polarization elements (not individually shown) that may be configured according to myriad polarization kernels, wherein each kernel may comprise a given configuration of two or more filter elements having different polarizations (e.g., selected from 0°, 45°, 90° 135°). It will also be understood that in some embodiments, each polarization filter element of a kernel may overlay an individual jot, whereas in some embodiments each polarization filter element of a kernel may overlay a group (e.g., an m×n array, where at least one of m and n is an integer greater than 1). For clarity of exposition, it should be understood that a given polarization filter element of a kernel, as used herein, refers to a kernel polarization filter element having a given polarization orientation; however, such a kernel element may in some embodiments comprise an array of neighboring individual filters (e.g., each formed over a respective jot) that have the same polarization orientation, or in some embodiments may comprise a continuous filter structure that may span an array of jots.

Figure 2:
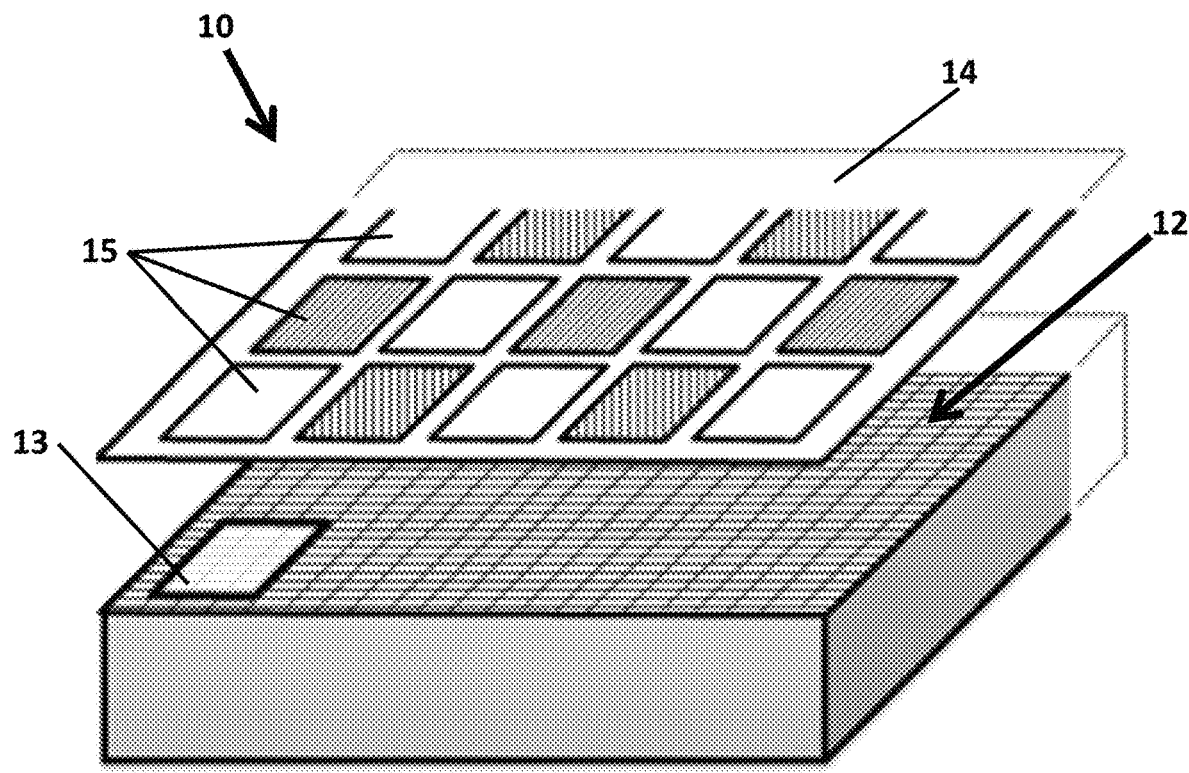
FIG. 2 schematically depicts a portion of a polarization filter array having individual kernel filter elements each disposed over a group of m×n jots of a QIS, in accordance with some embodiments.

From a fabrication standpoint, implementing each kernel filter element such that it that spans multiple jots (e.g., an array of jots) may ease fabrication (e.g., such as aligning filters to jots). Because a QIS employs a high level of oversampling, formation of a single polarization filter over multiple jots will not result in aliasing in the sampling of any of the polarization intensities. FIG. 2 schematically depicts a portion of a polarization filter array 12 having individual kernel filter elements 15 each disposed over a group 13 of m×n jots of QIS 10 comprising an array jots 12. As noted, this approach increases the tolerances required for filter fabrication and decreases the level of misalignment between jots and the polarization filters. The jots under a single polarization filter may be summed to produce a single pixel in the final image. And this approach will reduce the effect of cross talk from one jot to the other for jots located under the same filter.

Figure 3:
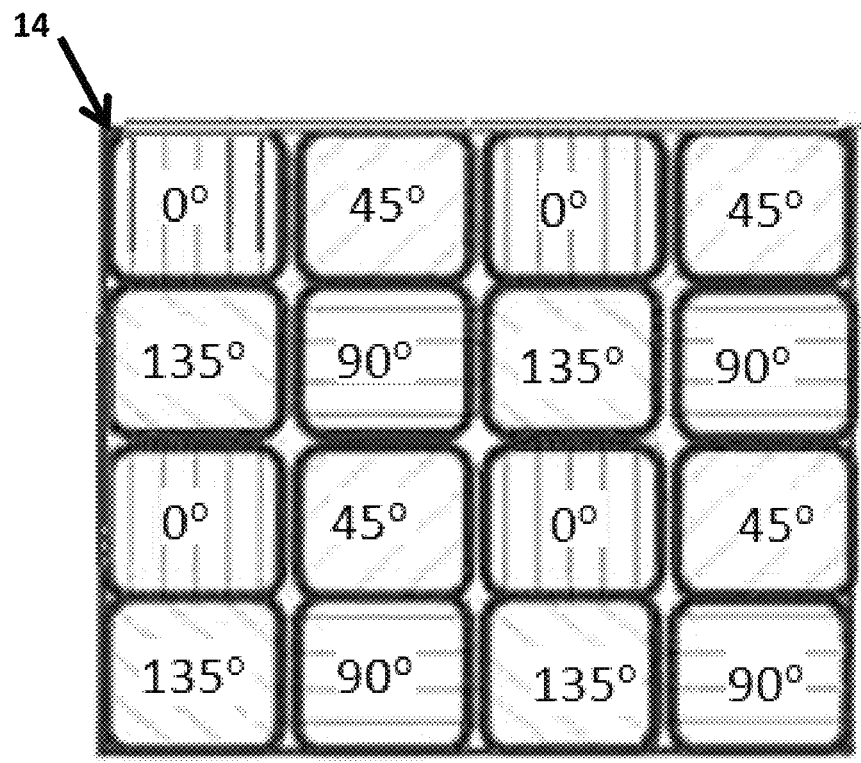
FIGS. 3 through 6 schematically depict portions of illustrative sample respective polarization filter arrays, in accordance with some embodiments.
Figure 4:
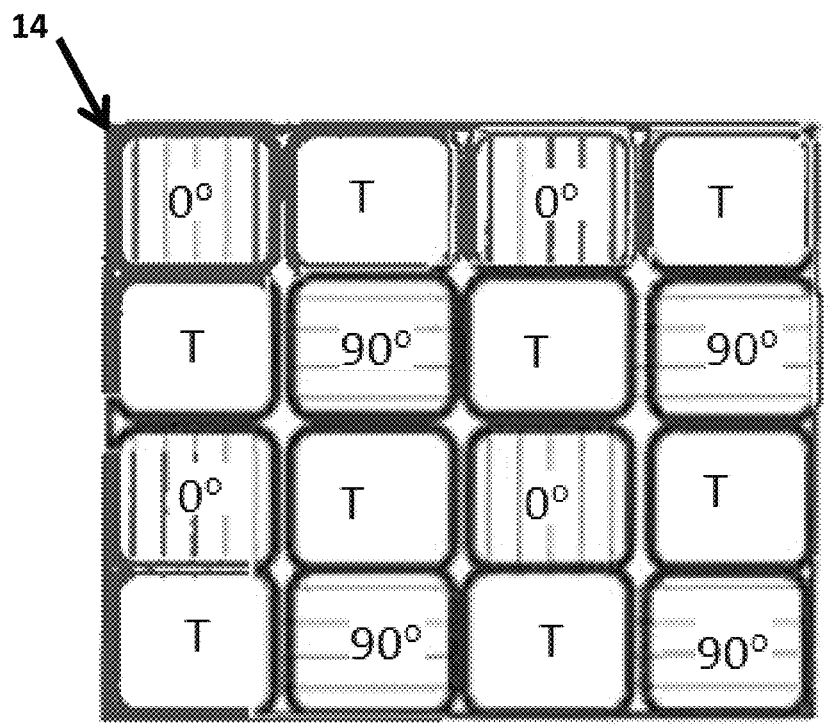

FIGS. 3 and 4 schematically depict portions of illustrative sample respective polarization filter arrays, in accordance with some illustrative (e.g., non-exclusive/non-limiting) embodiments. More specifically, FIG. 3 shows a 4×4 portion of a filter array pattern having 4 different polarization filters (transmitting 0°, 45°, 90°, and 135° polarized light) in a 2×2 kernel. In an alternative illustrative embodiment depicted in FIG. 4, the 2×2 kernel may be patterned to include 2 different polarization filters (transmitting 0° and 90° polarized light) and 2 filters elements T which transmit all polarizations. As described, in various alternative embodiments each kernel filter element may cover an individual jot or a group of jots, though as depicted these illustrative embodiments are directed to each filter covering an individual jot.

In accordance with some embodiments, one illustrative method of forming polarization filter arrays 14 in standard CMOS process is to use wire grid polarization filters, such as describe in S. W. Ahn, K. D. Lee, J. S. Kim, S. H. Kim, J. D. Park, S. H. Lee, and P. W. Yoon, "Fabrication of a 50 nm half-pitch wire grid polarizer using nanoimprint lithography," Nanotechnology 16, 1874-1877 (2005), which is hereby incorporated by reference herein in its entirety. These filters are created using periodic arrangement of metal wires. Such metal grids act as a diffraction grating when the period is comparable to the light wavelength or higher. When the metal grid period is less than the light wavelength, it acts as a polarizer. The electric field component parallel to wire grid excites electron motion in the metal grid which causes waves to be reflected back. The electric field perpendicular to the wire grid is however transmitted.

The efficiency of transmission of such filters is dependent on the period of metal wires. Higher transmittance requires decreased period of the metal grating. As a QIS, which requires small pixel pitches, will be realized in advanced process nodes such as 65 nm and below, it is suited to the use of wire grid polarizers, since very fine/small feature sizes can be realized and wire grids with periods much lower than the visible light wavelengths can be formed.

In accordance with the QIS single jot image sensor principles, the pixel in the final output may be formed from several jots. As mentioned earlier, the jots size may typically be much less than the Airy disk diameter of the diffraction-limited point response of the system. Therefore, several jots may be summed without compromising the resolution. For instance the pixel may be formed from a spatio-temporal kernel of size 16×16×16 jots. The "full well capacity" of such a pixel is dependent on the size of the kernel summed and can be varied dynamically. In color imaging, a single color filter can be formed for such a region of jots.

Figure 5:
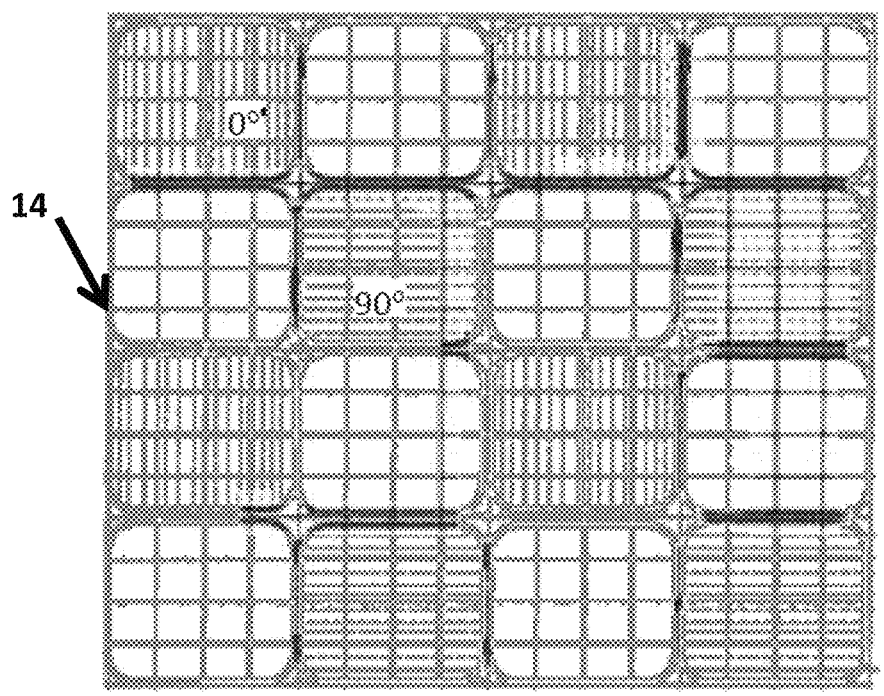
Figure 6:
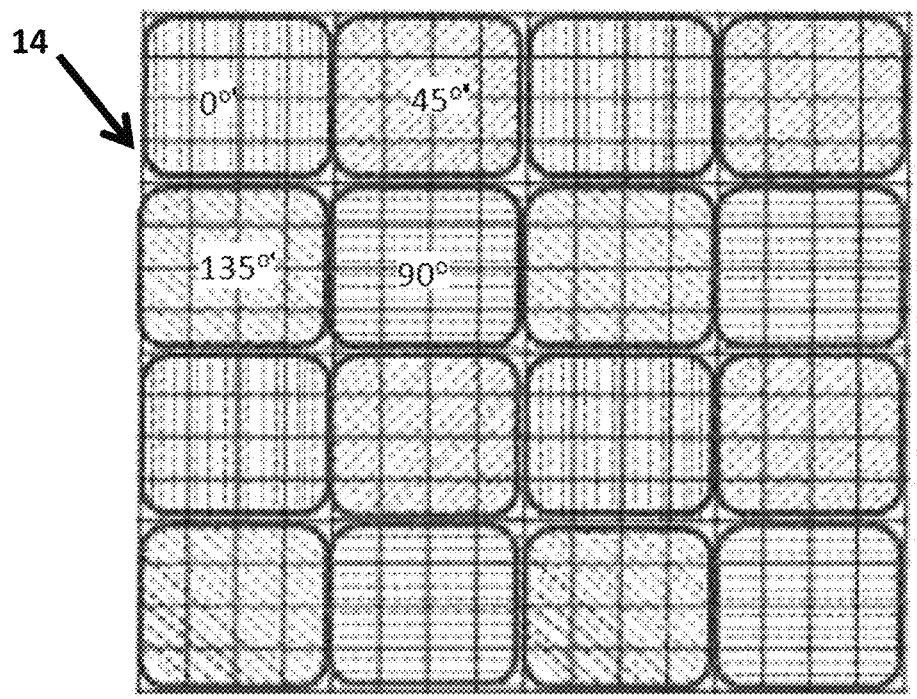

Similarly, as described, a single polarization filter may be used over multiple jots, especially jots that form the output of a single pixel. In accordance with some embodiments, FIGS. 5 and 6 depicts illustrative polarization filter patterns with each single filter kernel element disposed over a 4×4 jot area. More specifically, FIG. 5 implements a two-filter per kernel pattern and FIG. 6 implements a four-filter per kernel pattern, similar to the kernel patterns of FIGS. 4 and 3, respectively, but with each single polarization filter element of the kernel covering 16 jots.

In accordance with some embodiments, to obtain polarization information for each field in the single bit jot imager, several jots need to be summed to form a single pixel. With a single bit representing each polarization filter output, only 8 linear polarization angles can be represented when polarization filters for 0, 45, 90 and 135 degrees are used. As more bits are summed, for instance 16×16 jot pixels, more polarization angles can be represented and the accuracy of the calculated polarization angle improves.

Figure 7:
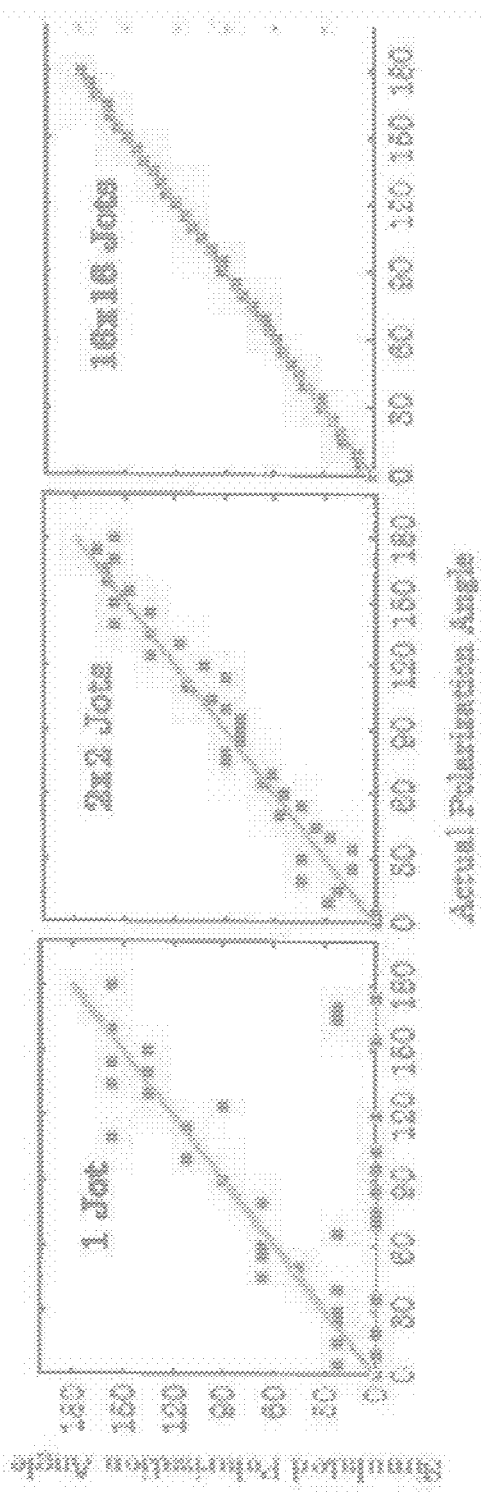
FIGS. 7A, 7B, and 7C show the results from illustrative non-limiting simulations of a polarization-QIS as may be implemented in accordance with some embodiments of the present disclosure for pixels recreated using 1×1, 2×2, and 16×16 jots, respectively.

FIGS. 7A, 7B, and 7C show the results from illustrative non-limiting simulations of a polarization-QIS as may be implemented in accordance with some embodiments of the present disclosure for pixels recreated using 1×1, 2×2, and 16×16 jots, respectively. In the simulations, an exposure level of 1 photon was assumed. A Poisson random function was used to vary photon arrival, and the polarized light transmitted through the different polarization filters is calculated using the law of Malus.

$$I=I_o \cos^2\varphi \quad (6)$$

where $\varphi$ is the angle between the polarization filter's transmission axis and the plane of polarization of the light. In the plots shown below, light polarized at different angles is used. The 1×1, 2×2, and 16×16 jot outputs are used to calculate the polarization angles. The polarization angle is calculated from the measured light intensity transmitted for each of the 0, 45, 90, and 135 degree filters using equations (1)-(3). As can be seen, as more jots are summed to form a pixel, the calculated polarization angles become more accurate. It is expected that calculation of the degree of polarization will also be more accurate as more jots are summed to form a pixel. Summing more jots increases the SNR of the signal for different polarization states which increases the accuracy in calculation of the Stokes parameters and by extension the degree and angle of polarization.

In addition, in accordance with some embodiments, the use of spatial oversampling allows both color and polarization information to be obtained without compromising the resolution. Polarization imagers typically do not produce color information, while color sensors are devoid of polarization information. According to some embodiments, polarization-sensitive single photon jots can be used along with color sensitive jots to simultaneously produce color and polarization images. Incorporating both polarization and color filters reduces the spatial frequency at which we sample both color and polarization information. However, since spatial sampling is being done at a frequency much higher than the Nyquist rate, it is possible to incorporate both color and polarization filters without risk of aliasing.

Figure 8:
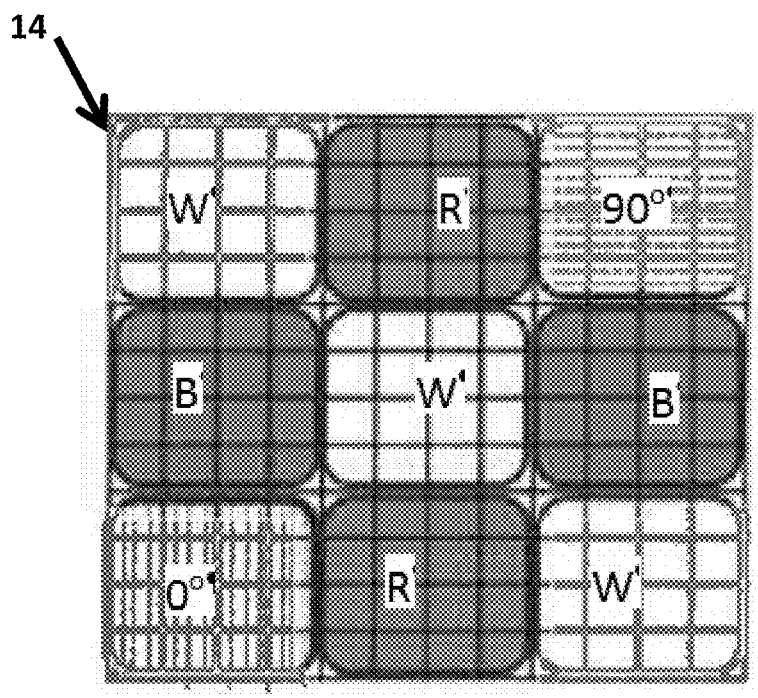
FIGS. 8-10 schematically depict illustrative filter patterns incorporating both color filters (red filters R, blue filters B, Green filters G, and white filters W) and polarization filters, in accordance with some embodiments.
Figure 9:
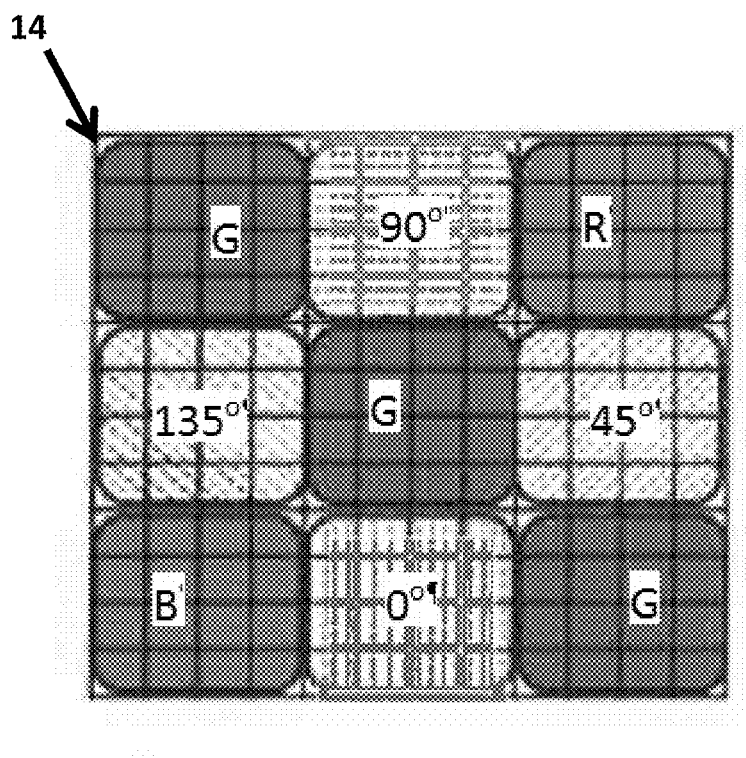
Figure 10:
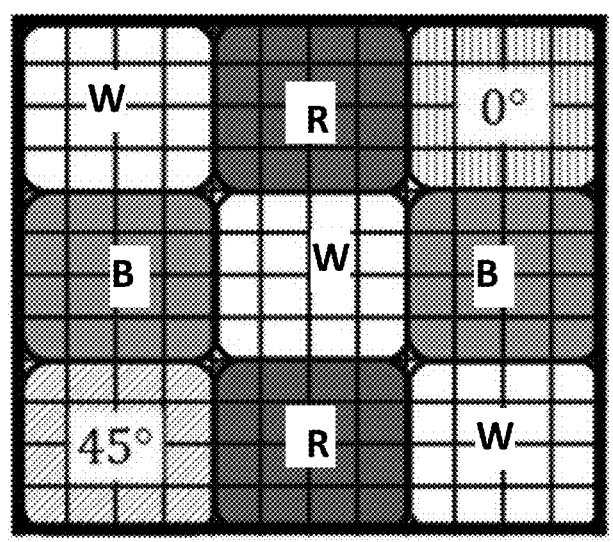

Illustrative filter patterns incorporating both color filters (red filters R, blue filters B, Green filters G, and white filters W) and polarization filters, in accordance with some embodiments, are shown in FIGS. 8-10.

In view of the present disclosure, it will be understood by those skilled in the art that myriad alternative embodiments may be implemented according to different patterns incorporating different color and/or polarization filters and/or number of jots covered by a given filter (e.g., the range of jots covered may vary from a single jot to several jots or more). In patterns which utilize white/panchromatic color filters, the white pixel data may be used together with red and blue to provide color information. It may simultaneously be used with 0° and 90° polarization filter data to calculate the degree of polarization.

The polarization or mixed color-polarization filter array may be used with either front-side-illuminated (FSI) or backside-illuminated (BSI) single-photon jot sensors. In the case of an FSI sensor, a wire grid polarization filter can be formed using one of the front-side metal layers. In BSI, backside metal grids used to define apertures may be used to form the polarization filters. In current BSI sensors, it is also possible to embed the color filters into the grid metal. This embedded technology may be used together with a patterned metal grid to form mixed color-polarization filter arrays with wire grid polarizers and embedded color filters. In accordance with some embodiments, a process such as is shown in FIG. 11 can be used to form such a mixed polarization-color filter arrays.

Figure 11:
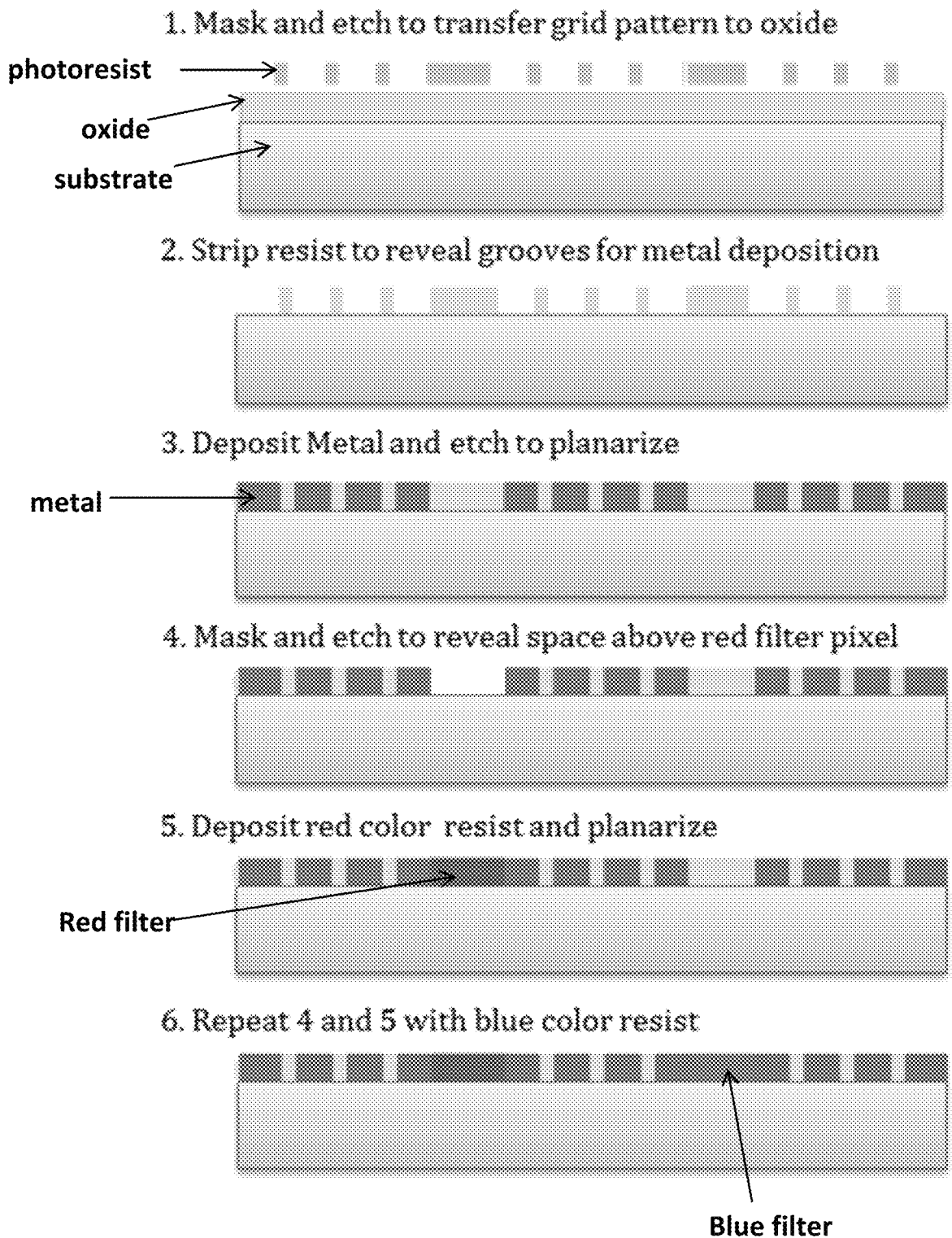
FIG. 11 schematically illustrates the steps of a sample fabrication process for a mixed color-polarization filter array comprising wire grid polarization filters and embedded color filters.

In the illustrative process outlined in FIG. 11, the color filters are formed in the same metal layer as the wire grid polarization filters. This keeps the stack thickness relatively low so that light acceptance isn't adversely impacted. This draws from the recent trend of embedded color filters, such as described in R. Fontaine, "The state-of-the-art of mainstream CMOS image sensors," in Proceedings of the International Image Sensors Workshop, Vaals, The Netherlands, Jun. 6-12, 2015, which is hereby incorporated by reference herein in its entirety. It is however possible to use two or more metal layers as well. Alternatively, in some embodiments, the mixed polarization color filter array may be formed entirely in the metal layer by implementing polarization and color filters with subwavelength metal grid patterns. The feasibility of color filter formation with subwavelength metal grids has been demonstrated in, e.g., H.-S. Lee, Y.-T. Yoon, S.-S. Lee, S.-H. Kim, and K.-D. Lee, "Color filter based on a subwavelength patterned metal grating," Opt. Express 15, 15457-15463 (2007), which is hereby incorporated by reference herein in its entirety.

In view of the present disclosure, it will be understood by those skilled in the art that by combining the single-photon jot imager technology with a polarization and color filtering technologies (in accordance with some embodiments), the many benefits of QIS for both polarization and color imaging are leveraged. Polarization imaging is often seen as a means of improving surveillance and tracking in hazy/foggy conditions, where a conventional color image provides little detail. According to some embodiments, the ability to dynamically change the sensitivity of the polarization imaging in regions where the color image alone lacks detail is leveraged.

Additional aspects and features of some embodiments of the present invention will be understood in view of the publication authored by the present inventors, "Application of the Quanta image sensor concept to linear polarization imaging a theoretical study," Journal of the Optical Society of America A, vol. 33, no. 6, June 2016, which is incorporated herein by reference in its entirety, and which forms part of the disclosure of U.S. Provisional Application No. 62/488,611, filed Apr. 21, 2017, to which the present application claims priority.

The present invention has been illustrated and described with respect to some specific illustrative embodiments thereof, which embodiments are merely illustrative of some of the principles of some embodiments of the invention and are not intended to be exclusive or otherwise limiting embodiments. Accordingly, although the above description of illustrative embodiments of the present invention, as well as various illustrative modifications and features thereof, provides many specificities, these enabling details should not be construed as limiting the scope of the invention, and it will be readily understood by those persons skilled in the art that the present invention is susceptible to many modifications, adaptations, variations, omissions, additions, and equivalent implementations without departing from this scope and without diminishing its attendant advantages. For instance, except to the extent necessary or inherent in the processes themselves, no particular order to steps or stages of methods or processes described in this disclosure, including the figures, is implied. In many cases the order of process steps may be varied, and various illustrative steps may be combined, altered, or omitted, without changing the purpose, effect or import of the methods described. Similarly, the structure and/or function of a component may be combined into a single component or divided among two or more components. It is further noted that the terms and expressions have been used as terms of description and not terms of limitation. There is no intention to use the terms or expressions to exclude any equivalents of features shown and described or portions thereof. Additionally, the present invention may be practiced without necessarily providing one or more of the advantages described herein or otherwise understood in view of the disclosure and/or that may be realized in some embodiments thereof. It is therefore intended that the present invention is not limited to the disclosed embodiments but should be defined in accordance with claims that are based on the present disclosure, as such claims may be presented herein and/or in any patent applications claiming priority to, based on, and/or corresponding to the present disclosure.

What is claimed is:

1. An image sensor comprising:
a quanta image sensor comprising an array of jots and configured for spatial and temporal oversampling; and
a polarization filter array monolithically integrated with the quanta image sensor.

2. The image sensor according to claim 1 wherein the jots are single-bit jots.

3. The image sensor according to claim 1, wherein the jots are multibit jots.

4. The image sensor according to claim 1, wherein the image sensor is for backside illumination.

5. The image sensor according to claim 1, wherein the polarization filter array comprises a kernel of polarization filter elements, with a given polarization filter of the kernel having a given polarization angle and being disposed over a respective group of jots such that the a pixel with a single polarization output corresponding to the given polarization is determined based on a sum of the outputs of the group of jots.

6. The image sensor according to claim 1, wherein at least one of the filter elements in the polarization filter array transmits unpolarized light.

7. The image sensor according to claim 1, wherein the polarization filter array comprising a kernel of polarization filter elements is integrated with a color filter array comprising a kernel of at least two or more color filter elements, wherein the color filter array and polarization filter array cover different jots, thereby providing a mixed color-polarization filter array that provides for acquiring both polarization and color information of the photons detected by the quanta image sensor.

8. The image sensor according to claim 7, wherein the mixed color-polarization filter array comprises a patterned metal grid with color filters embedded in the metal grid.

* * * * *